US012583738B2

(12) United States Patent
Patel et al.

(10) Patent No.: US 12,583,738 B2
(45) Date of Patent: Mar. 24, 2026

(54) MEMS DIAPHRAGM AND MEMS SENSOR

(71) Applicant: AAC Technologies Pte. Ltd., Singapore (SG)

(72) Inventors: Anup Patel, Eb (GB); Scott Lyall Cargill, Eb (GB); Euan James Boyd, Eb (GB)

(73) Assignee: AAC Technologies Pte. Ltd., Singapore (SG)

( * ) Notice: Subject to any disclaimer, the term of this patent is extended or adjusted under 35 U.S.C. 154(b) by 434 days.

(21) Appl. No.: 18/178,565

(22) Filed: Mar. 6, 2023

(65) Prior Publication Data

US 2024/0300806 A1 Sep. 12, 2024

(51) Int. Cl.
B81B 3/00 (2006.01)
H04R 7/02 (2006.01)
H04R 19/04 (2006.01)

(52) U.S. Cl.
CPC ............ B81B 3/0072 (2013.01); H04R 7/02 (2013.01); H04R 19/04 (2013.01); *B81B 2201/0257* (2013.01); *B81B 2203/0127* (2013.01); *B81B 2203/0307* (2013.01); *H04R 2201/003* (2013.01)

(58) Field of Classification Search
CPC ........ H04R 7/02; H04R 19/04; H04R 19/005; H04R 2201/003; H04R 23/006; H04R 1/028; H04R 31/00; H04R 2499/15; B81B 3/0072; B81B 2203/0127; B81B 2201/0257; B81B 2203/0307; B81B 3/007; B81B 2203/0163; G09G 5/363; G09G 3/346; B81C 1/00158
USPC .......... 381/91, 170, 171, 172, 173, 174, 175
See application file for complete search history.

(56) References Cited

U.S. PATENT DOCUMENTS

2020/0137501 A1* 4/2020 Piechocinski .......... H04R 1/086
2021/0300753 A1* 9/2021 Rasmussen ........... B81B 3/0021

FOREIGN PATENT DOCUMENTS

CN 206164826 U * 5/2017 .............. H04R 7/14
CN 111137842 A * 5/2020 .......... B81B 3/0021

* cited by examiner

*Primary Examiner* — Carolyn R Edwards
*Assistant Examiner* — Julie X Dang
(74) *Attorney, Agent, or Firm* — Wiersch Law Group

(57) ABSTRACT

An MEMS diaphragm and an MEMS sensor. The MEMS diaphragm includes: a main diaphragm including a main body sensing portion and beam portions, and the beam portions are connected to an outer edge of the main body sensing portion; an additional material layer provided on the beam portions or provided on both an edge of the main body sensing portion and on the beam portions. The intrinsic tensile stress of the additional material layer is greater than an intrinsic tensile stress of the main body sensing portion. An additional material layer is provided, which mechanically reinforces the diaphragm region experiencing high stress during a pressure pulse, and the intrinsic tensile stress of the additional material layer is greater than the main body sensing portion, thereby ensuring the compliance of the main diaphragm.

11 Claims, 6 Drawing Sheets

MEMS DIAPHRAGM AND MEMS SENSOR

TECHNICAL FIELD

The present disclosure relates to the technical field of micro-electro-mechanical systems, in particular to an MEMS diaphragm and an MEMS sensor.

BACKGROUND

Diaphragms used in MEMS devices such as MEMS microphones have a number of constraints related to performance, manufacturability and cost.

Common constraints include limits on the diaphragm size due to correlation between die size and cost, minimum compliance requirements to meet target sensitivity and robustness or reliability targets which limit the maximum stress the diaphragm can experience due to a pressure shock. These constraints are usually opposed to each other. A small diaphragm size has an inherently lower compliance and a high compliance diaphragm has inherently lower robustness performance as it deforms more for a given pressure shock.

In conventional diaphragms, the design space is typically limited to a diaphragm of a single material with simple anchor beams perpendicular to the diaphragm edge. These diaphragms usually need to be large (e.g. 1 mm diameter) to meet compliance requirements whilst being robust. Additionally, the robustness of these diaphragms is typically limited by a few weak areas of the beam anchors where stress concentrates during a pressure impulse.

In conventional diaphragms, additional material layers can be added to reinforce regions which experience the highest stress during a pressure shock such as the beams. However, this additional material layer results in a significant reduction in membrane compliance and hence MEMS sensitivity. The additional material layer typically has a similar intrinsic stress to the main membrane material and does not typically extend around the whole perimeter of the membrane in the form of a ring.

SUMMARY

The object of the present disclosure is to provide an MEMS diaphragm and an MEMS sensor which can significantly improve the robustness of a diaphragm without affecting the compliance and the size of a diaphragm. This is achieved by exploiting a compressive hoop stress which exists in a ring of additional material when its intrinsic stress is higher than that of a base diaphragm material.

In a first aspect, the present disclosure provides a MEMS diaphragm, including: a main diaphragm including a main body sensing portion and beam portions, and the beam portions are connected to an outer edge of the main body sensing portion; an additional material layer provided on the beam portions or provided on both an edge of the main body sensing portion and on the beam portions. The intrinsic tensile stress of the additional material layer is greater than an intrinsic tensile stress of the main body sensing portion.

As an improvement, the additional material layer is embedded in the main body sensing portion such that it is in plane with the rest of the main body sensing portion layer.

As an improvement, the additional material layer is stacked on top or bottom of the main body sensing portion.

As an improvement, the additional material layer is provided with through holes.

As an improvement, the additional material layer is provided with concentrically arranged annular slots, and the annular slots are sequentially arranged at intervals along a radial direction of the main body sensing portion.

As an improvement, the additional material layer is provided with strip-shaped slots, and the strip-shaped slots are arranged at annular intervals with an axis of the main body sensing portion as a center line.

As an improvement, the beam portion is in a T-shape and includes a fixing beam between anchors and a connecting beam perpendicular to the fixing beam, one end of the connecting beam is connected to a middle portion of the fixing beam, and the other end of the connecting beam is connected to the main body sensing portion.

As an improvement, arc notches are formed on opposite sides of the connecting beam.

As an improvement, anchor portions are provided at both ends of the fixing beam.

As an improvement, the additional layer is made of silicon nitride, and the main layer is made of poly silicon.

As an improvement, the additional layer has a stress higher than 100 MPa without a stress gradient.

In a second aspect, the present disclosure also provides an MEMS sensor, which includes the aforementioned MEMS diaphragm.

Compared with the related art, the present disclosure provides an additional material layer on the main diaphragm, the additional material layer mechanically reinforces the diaphragm region experiencing high stress during a pressure pulse, and the intrinsic tensile stress of the additional material layer is greater than the main body, thereby maintaining the compliance of the main diaphragm.

REFERENCE SIGNS

10—main diaphragm, 11—main body sensing portion, 12—beam portion, 121—fixing beam, 122—connecting beam, 123—arc notch, 13—anchor portion; 20—additional material layer, 21—through hole, 22—annular slot, 23—strip slot.

DESCRIPTION OF EMBODIMENTS

The embodiments described below by referring to the figures are exemplary only for explaining the present disclosure and should not be construed as limiting the present disclosure.

Figure 1:
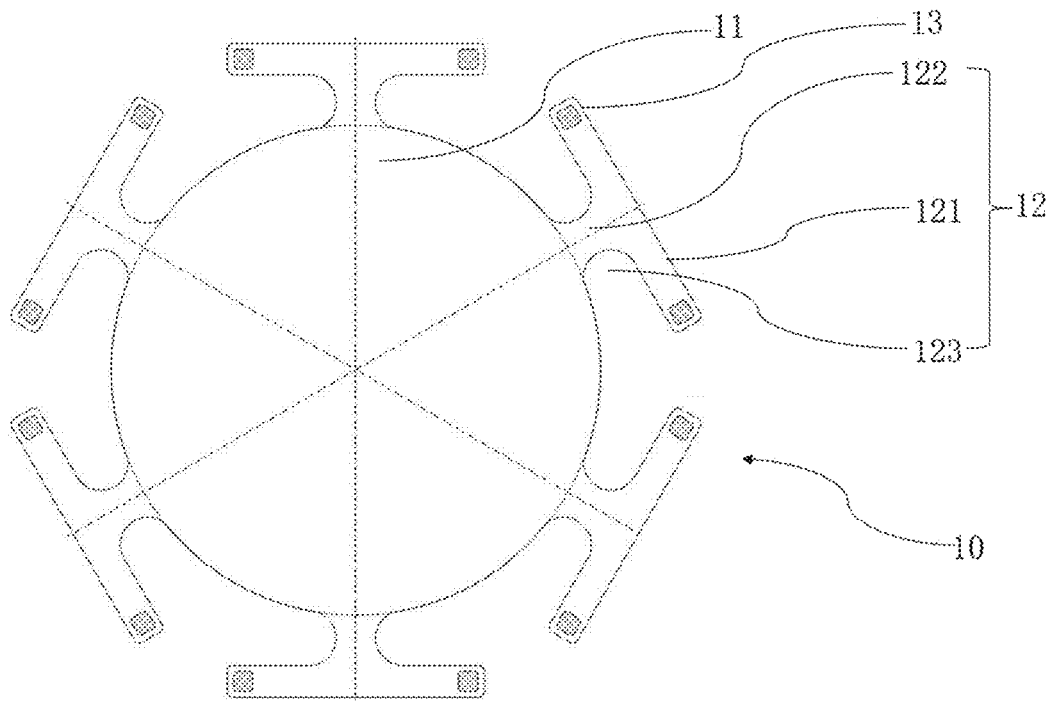
FIG. 1 is a schematic structural diagram of a main diaphragm with six T-beams without an additional material later.
Figure 2:
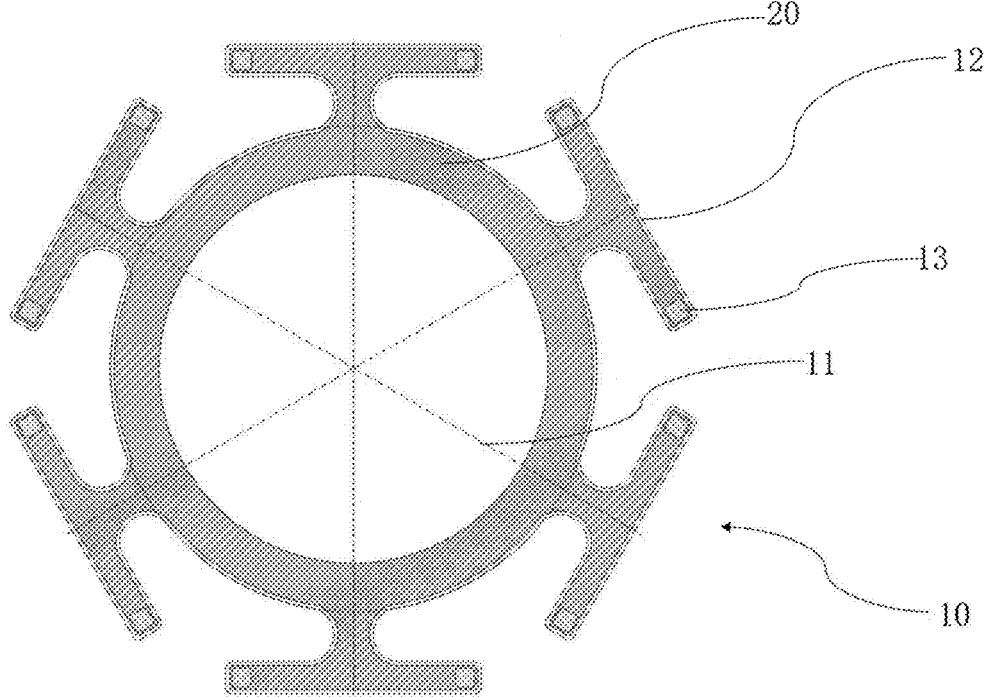
FIG. 2 is a schematic structural diagram of an additional material layer provided on outer regions of a main diaphragm according to an embodiment of the present disclosure.

As shown in FIGS. 1 and 2, the present disclosure provides an MEMS diaphragm, including a main diaphragm 10 and an additional material layer 20.

The main diaphragm 10 includes a main body sensing portion 11 and beam portions 12, and the beam portions 12 are connected to the outer edge of the main body sensing portion 11 at annular intervals. In an embodiment, the main diaphragm 10 is anchored on the substrate (not shown), a front cavity is provided along an axial direction of the substrate. Optionally, the inner contour surface of the front cavity is a circular slot structure, and the beam portion 12 is configured to suspend the main body sensing portion 11 and cover the front cavity. The main body sensing portion 11 is configured to sense sound pressure. Under the action of sound pressure, the main body sensing portion 11 reciprocates relative to the sound pressure direction, which causes the capacitance to change and output an electrical signal.

Referring to FIGS. 1 and 2, the beam portion 12 includes a fixing beam 121 and a connecting beam 122, one end of the connecting beam 122 is connected to the middle of the fixing beam 121, and the other end of the connecting beam 122 is connected to the main body sensing portion 11. In an embodiment, the fixing beam 121 is a strip-shaped structure, anchor portions 13 are provided at both ends of the fixing beam 121, and the fixing beam 121 is fixed on the substrate through the anchor portions 13, and the connecting beam 122 can also be a strip-shaped structure. The long-axis direction of the connection section 122 is perpendicular to the long-axis direction of the fixing beam 121, the length of the fixing beam 121 is larger than the connecting beam 122 which increases the compliance of the main diaphragm 10 and thus reduces the acceptable compliance of the main body sensing portion Referring to FIG. 1, the opposite sides of the connecting beam 122 are formed with arc notches 123, and a smooth transition connection is formed between the fixing beam 121 and the main body sensing portion 11, thereby reducing stress concentration and improving the performance of the main body sensing portion 11, and thus increasing the reliability of the MEMS sensor.

In an embodiment according to the present disclosure, the material of the main body sensing portion 11 and beam portion 12 can be polysilicon, the main body sensing portion 11 is circular, and the six beam portions 12 are arranged in the circumferential direction of the main body sensing portion 11 at equal intervals. Those skilled in the art can understand that the main body sensing portion 11 can have other shapes, such as square and the like, and the number of beam portions 12 can also be increased or decreased. The layout of the beam portions 12 can be determined according to the shape of the main body sensing portion 11, which is not limited here.

By distributing the beam portions 12 on the outer edge of the main body sensing portion 11, the compliance of the main body sensing portion 11 is improved, thereby generating better output signal. The deflection of the diaphragm 10 is approximately parabolic, the deflection of the main body sensing portion 11 at the center of the circle is the largest, and the deflection of the beam portion 12 at the edge position is relatively small. The main body sensing portion 11 is arranged on a position of the main diaphragm 10 having the most intense movement, that is, the middle of the main diaphragm 10, and the main body sensing portion 11 is not provided at the edge of the main diaphragm 10, so that the sensitivity of the main diaphragm 10 can be improved.

Figure 6:
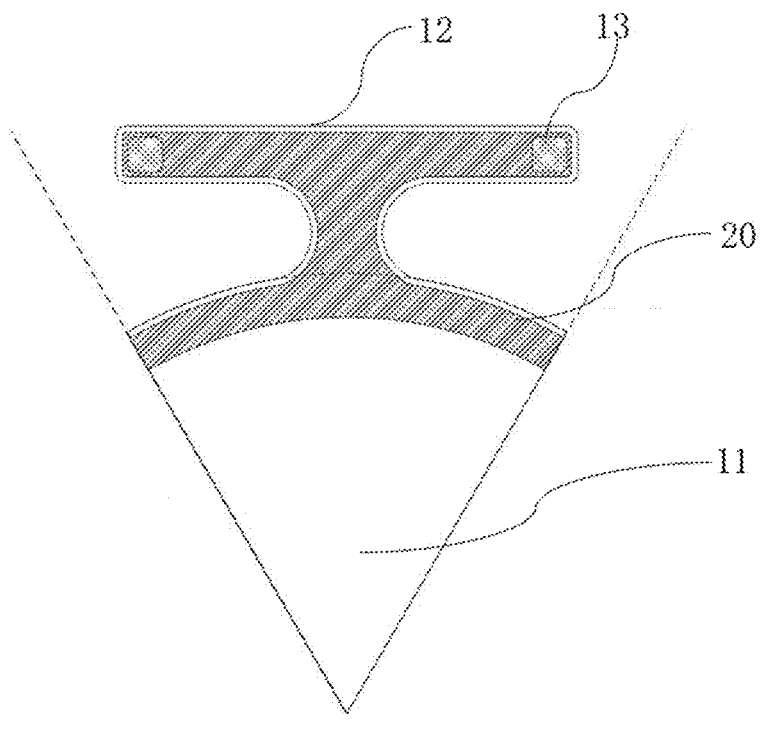
FIG. 6 is a one sixth sector schematic structural diagram with the additional material layer on the beams and as a ring on the outer edge of the main body sensing portion.
Figure 7:
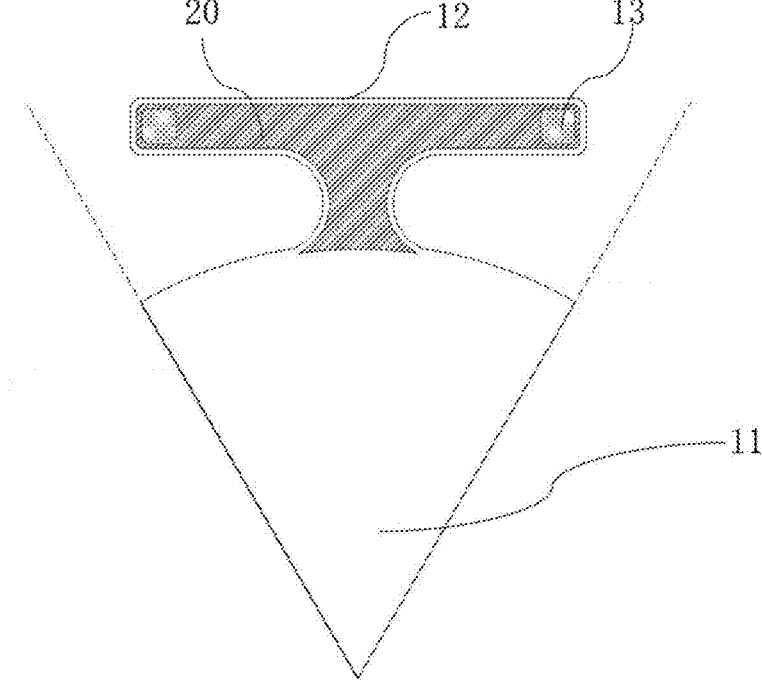
FIG. 7 is a one sixth sector schematic structural diagram with the additional material layer only on the beams.

As shown in FIGS. 2, 6 and 7, the additional material layer 20 is provided on the beam portion 12, or the additional material layer 20 is provided on the edge of the main body sensing portion 11 and the beam portion 12. As shown in FIG. 6, when the additional material layer 20 is on the edge of the main body sensing portion 11 and on the beam portion 12 at the same time, the additional material layer 20 on the main body sensing portion 11 is annular-shaped, and the annular-shaped additional material layer 20 is arranged on a region of the main body sensing portion 11 having relatively small deformation. The shape of the additional material layer 20 located on the beam portion 12 is adapted to the shape of the beam portion 12. By adding an additional layer of material 20, the diaphragm regions that experience high stress during pressure pulses are mechanically stiffened, which significantly increases the robustness of the main diaphragm 10 without affecting the diaphragm dimension.

In order to avoid the existence of the additional material layer 20 from causing the main body sensing portion 11 to become stiff and thus reducing the compliance of the main body sensing portion 11, the intrinsic tensile stress of the additional material layer 20 is greater than the intrinsic tensile stress of the main body sensing portion 11. In an embodiment of the present disclosure, the intrinsic tensile stress of the additional material layer 20 is higher than 100 MPa, and the intrinsic tensile stress of the additional material layer 20 is transferred to the main body sensing portion 11, thereby overcoming the problem of stiffness effect caused by adding thicker additional material layer 20 at the edge portion of the main body sensing portion 11, which improves the robustness of the main body sensing portion 11 without reducing the compliance and diaphragm size of the main body sensing portion 11.

Figure 13:
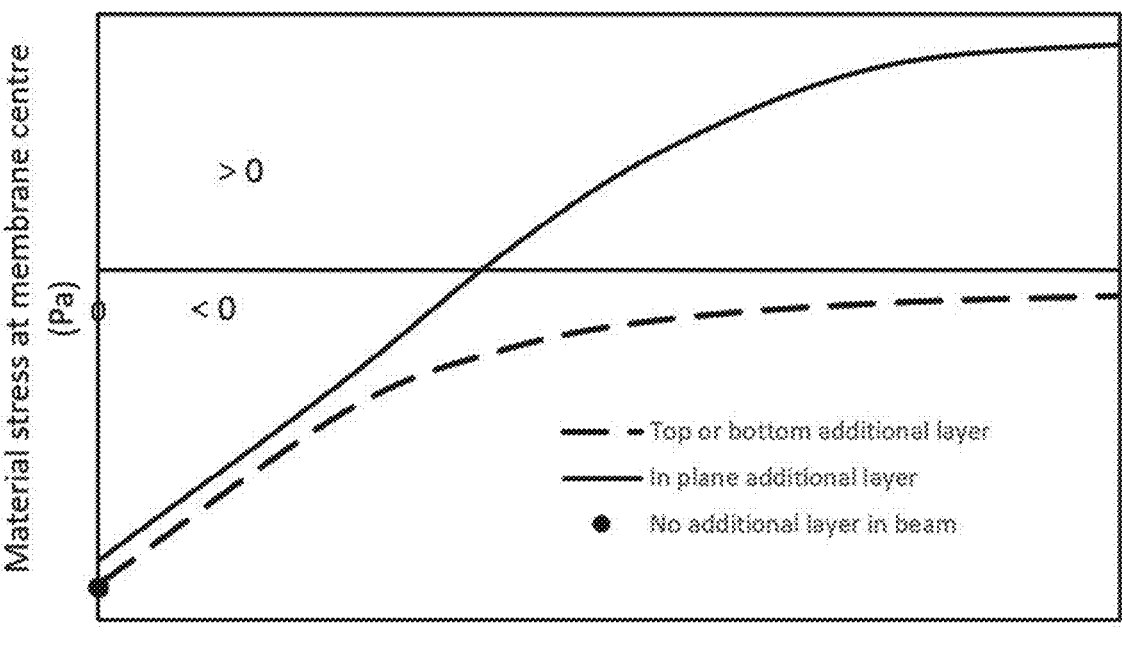
FIG. 13 is example simulation results for the central stress of the center of the main body sensing portion of the diaphragm under zero pressure.

In an embodiment according to the present disclosure, the additional layer 20 is made of silicon nitride, and the additional layer 20 has a stress higher than 100 MPa without a stress gradient. The main layer 10 is made of poly silicon, and the main layer 10 has a stress gradient across the thickness of the main layer 10. Those skilled in the art can understand, the material of the additional layer 20 and the main layer 10 can be adapted according to actual requirements This effect on compliance of the ring of additional material 20 occurs because the intrinsic tensile stress of the additional material layer 20 causes a hoop stress which acts to reduce the circumference of the ring section and hence acts to move the additional material 20 radially inwards. If the intrinsic stress of the additional material 20 is greater than the main body sensing portion 11, the hoop stress in the additional material 20 applies a noticeable radially compressive stress to the main body sensing portion at its outer edge. Example simulation results in FIG. 13 illustrate this effect by showing the reduction is tensile stress of the main body sensing portion 11 at its center, when the width of the ring of additional material 20 is increased from zero. The effect can be strong enough to give the main body sensing portion 11 a compressive stress as shown for larger ring widths.

Figure 3:
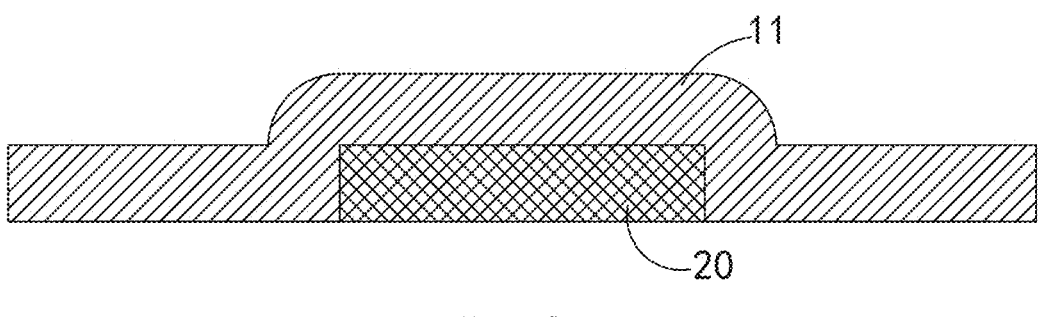
FIG. 3 is a schematic cross-section showing an additional material layer embedded in a main body sensing portion such that it is in plane with the rest of the main body sensing portion layer.

Referring to FIG. 3, the additional material layer 20 is embedded in the main body sensing portion 11, and at the joint between the edge of the main body sensing portion 11 and the beam portion 12, the edge of the main body sensing portion 11 is folded upwards to form a folded section. One end of the folded section is connected to the beam portion 12, the surface of the beam portion 12 is substantially flush with the surface of the main body sensing portion 11, and the folded section is higher than the main body sensing portion 11, thereby forming a slot. The additional material layer 20 is embedded in this slot, and the additional material layer 20 is limited in the radial direction of the main diaphragm 10. The main body sensing portion 11 and the additional material layer 20 form an integral structure, under the action of sound pressure, the main body sensing portion 11 deforms, and the additional material layer 20 is limited in the slot. Since the intrinsic tensile stress of the additional material layer 20 is greater than the intrinsic tensile stress of the main body sensing portion 11, the additional material layer 20 transfers the radial compressive stress to the main body sensing portion 11, to avoid reduction of the compliance of the main body sensing portion 11.

Figure 11:
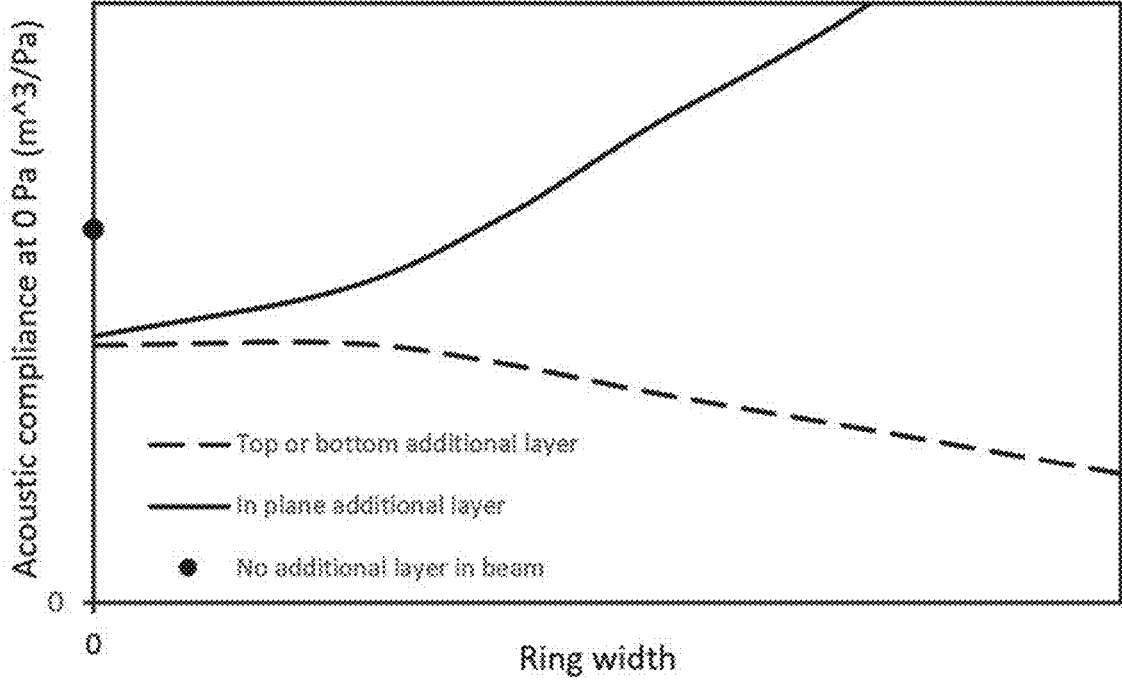
FIG. 11 is example simulation results for compliance of a main diaphragm under 0 Pa applied pressure versus width of the additional material.
Figure 12:
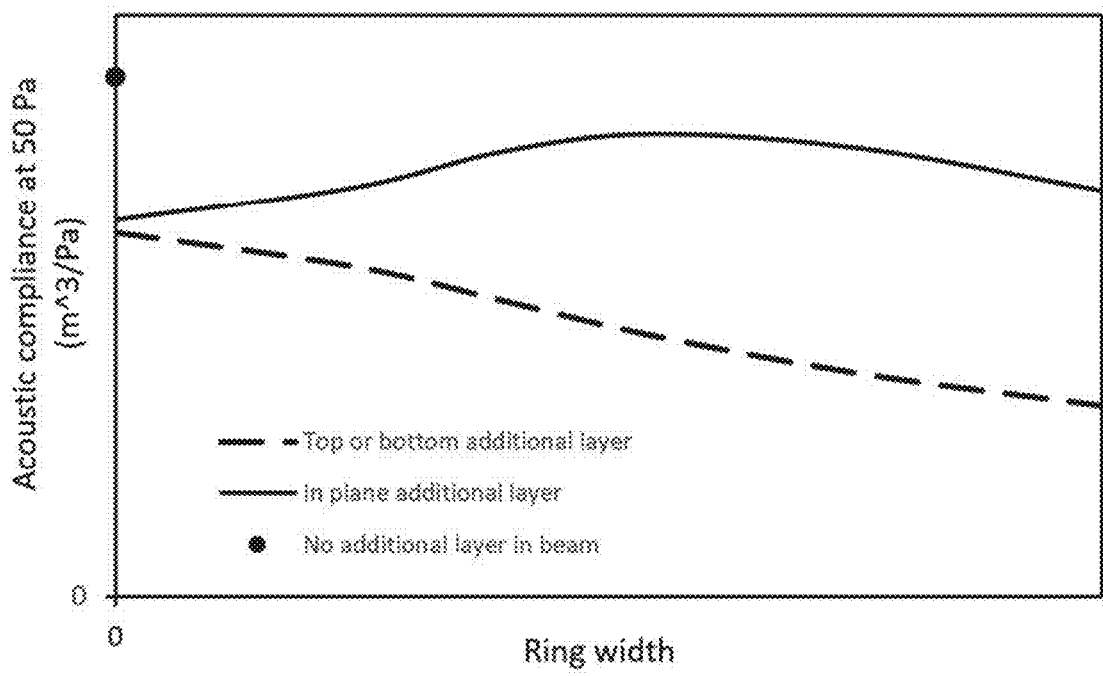
FIG. 12 is example simulation results for compliance of a main diaphragm under 50 Pa applied pressure versus width of the additional material

As shown in FIGS. 11 to 13, under the condition of zero pressure, as the ring width of the additional material layer 20 increases, the compliance of the main body sensing portion 11 gradually increases, and the additional material layer 20 transfers greater radial compressive stress to the center of the main body sensing portion 11. The main body sensing portion is typically under an electrostatic force due to a bias voltage, the effect of which can be approximated by an additional uniform pressure. Under the condition of additional 50 Pa pressure (or other reasonable pressure values), as the width of the additional material layer 20 increases, the compliance of the main body sensing portion 11 increases and tends to be stable, significantly reducing the difference between the compliance for no additional material layer anywhere and the compliance with additional material layer 20 in the beam portion and outer ring. It can be seen that embedding an additional material layer 20 of a certain width in the main body sensing portion 11 can significantly improve the robustness of the main diaphragm 10 without affecting the compliance.

Figure 4:
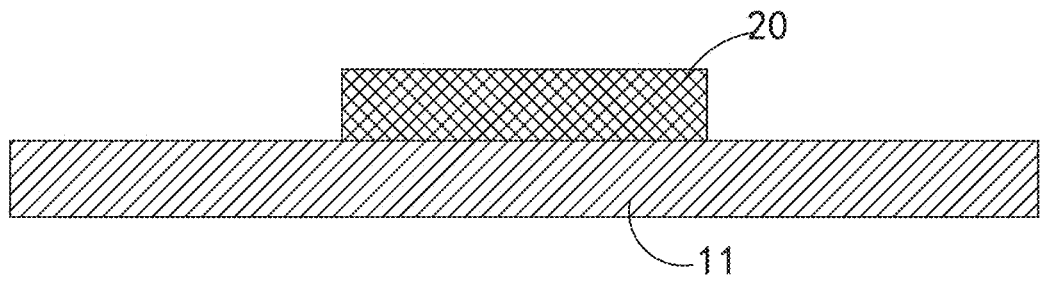
FIG. 4 is a schematic cross-section showing an additional material layer stacked on top of a main body sensing portion according to an embodiment of the present disclosure.
Figure 5:
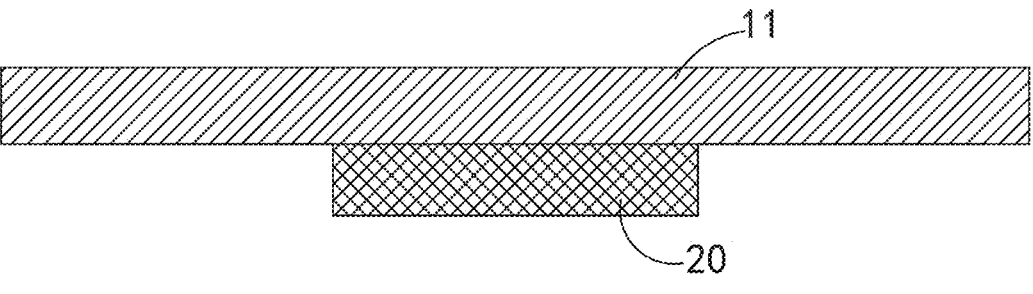
FIG. 5 is a schematic structural diagram showing an additional material layer stacked on bottom of a main body sensing portion according to an embodiment of the present disclosure.

Referring to FIGS. 4 and 5, the additional material layer 20 is stacked on the top or bottom of the main body sensing portion 11, and the additional material layer 20 is not limited in the radial direction of the main diaphragm 10. The radial compressive stress of the additional material layer 20 is less transferred to the main body sensing portion 11 due to the reduced contact surface area between the two material layers. Although the additional material layer 20 still reduces the tensile stress of the main body sensing portion 11 as seen in FIG. 13, this effect is outweighed by the stiffening effect of the additional material layer 20 provided on the top or bottom of the main body sensing portion 11.

As shown in FIGS. 11 to 12, under the condition of zero pressure and under the condition of additional 50 Pa pressure (or other reasonable pressure value), as the ring width of the additional material layer 20 increases, the compliance of the main body sensing portion 11 decreases, and the robustness of the main body sensing portion 11 is improved to a certain extent. Referring to FIG. 13, under the condition of zero pressure, as the ring width of the additional material layer 20 increases, the additional material layer 20 transfers gradually decreased radial stress to the center of the main body.

Although not shown in the figures, if the configuration shown in FIGS. 4 and 5 is the only possible due to the silicon process constraints, choosing the intrinsic tensile stress of the additional material layer 20 to be higher than the main body sensing portion 11 can still reduce the stiffening effect if the additional material layer 20 is needed for robustness.

Figure 8:
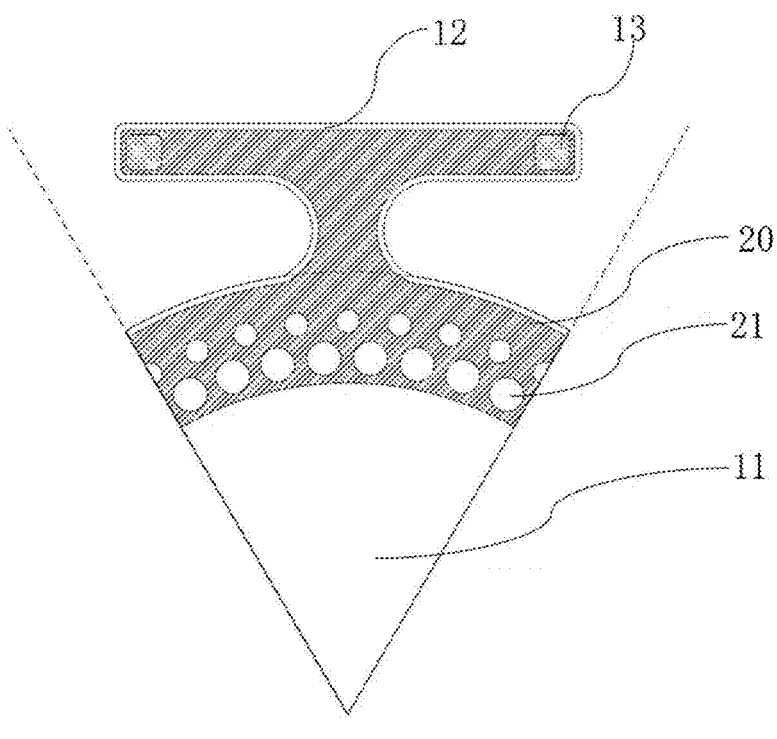
FIG. 8 is a one sixth sector schematic structural diagram with the additional material layer being a perforated ring on the outer edge of the main body sensing portion.

Referring to FIG. 8, the additional material layer 20 is provided with through holes 21. These have the effect of smoothing the transition of material properties from the two layer to single layer membrane. It also allows for relief holes to be more easily added through the main membrane layer.

In an embodiment, the through holes 21 can be circular holes, and the through holes 21 are divided into several groups, and multiple through hole groups are arranged at intervals along the radial direction of the main diaphragm 10. Each through hole group is provided with multiple through holes 21 arranged at annular intervals with the axis of the main diaphragm 10 as the center line. The inner diameters of the through holes 21 in the same through hole group are the same, and the through holes in adjacent through hole groups have different inner diameters. Along the radial direction of the main diaphragm 10, the inner diameters of the through holes 21 in the adjacent through hole groups increase or decrease in a gradient. Those skilled in the art can understand that the inner diameters of the through holes 21 in adjacent through hole groups may also be the same, which is not limited here.

Figure 9:
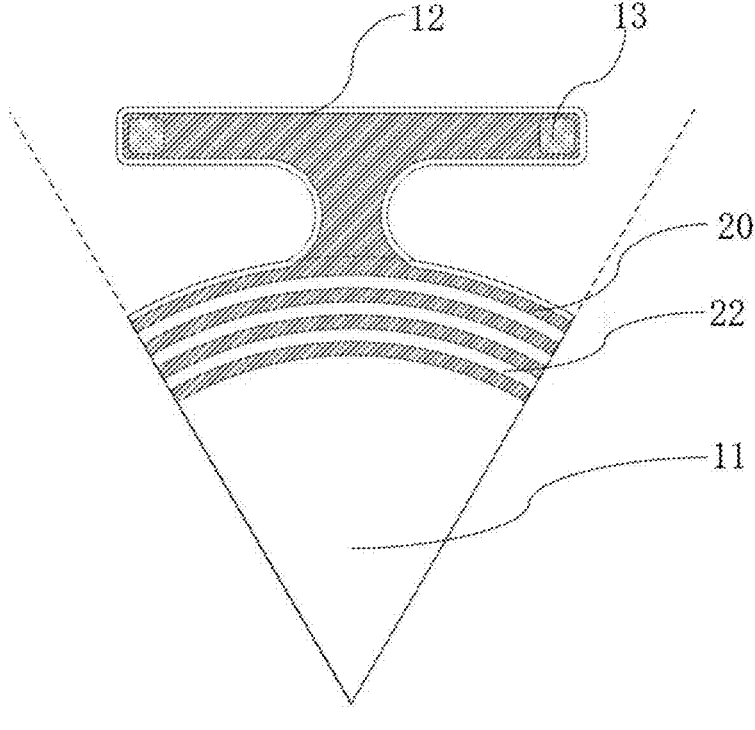
FIG. 9 is a one sixth sector schematic structural diagram with the additional material layer being a ring with concentrically arranged annular slots on the outer edge of the main body sensing portion

Referring to FIG. 9, the additional material layer 20 is provided with concentric annular slots 22, and the annular slots 22 are sequentially arranged at intervals along the radial direction of the main body sensing portion 11. These have a similar compressive ring effect as in FIG. 6 and the associated benefits for robustness, but allow for lower stiffness in the edge of the main body sensing portion 11 which is attractive if a more pistonic membrane deformation is desired.

In an embodiment, the slot width of each annular slot 22 is the same, and the distance between adjacent annular slots 22 is also the same. The farther away from the annular slot 22 of the main body sensing portion 11, the larger radius of the annular slot 22.

Figure 10:
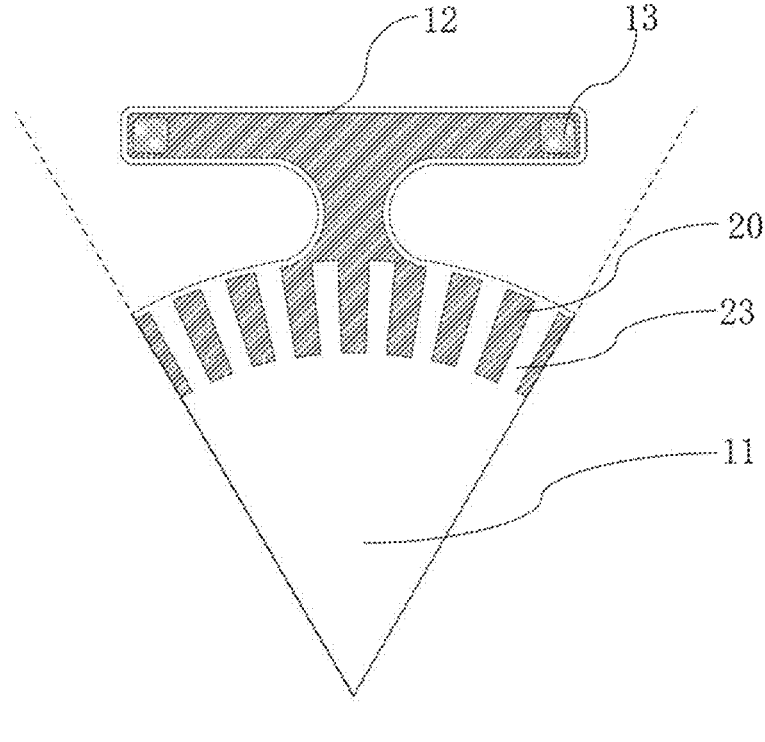
FIG. 10 is a one sixth sector schematic structural diagram with the additional material layer being a ring with strip-shaped slots on the outer edge of the main body sensing portion

Referring to FIG. 10, the additional material layer 20 is provided with strip-shaped slots 23, and the strip-shaped slots 23 are arranged at annular intervals with the axis of the main body sensing portion 11 as the center line. The strip-shaped slots 23 limit the compressive effect of the additional material layer 20, whilst still reinforcing the membrane when contacting the substrate during a downward pressure pulse. The effect of the slots on membrane compliance is very limited which is advantageous if you want a reinforced membrane design that is as stable as possible to natural process variation and a compliance that is not affected by uncertainties in the properties of the additional layer such as its intrinsic stress.

In an embodiment, the slot width of each strip-shaped slot 23 is the same, and the included angle between adjacent strip-shaped slots 23 is the same, and the strip-shaped slot 23 can be a rectangular structure or a tapered structure. When the strip-shaped slot When 23 is a rectangular structure, it extends along the radial direction of the main body sensing portion 11, and the slot width of the strip slot 23 remains consistent. When the strip slot 23 is a tapered structure, it extends along the radial direction of the main body sensing portion 11, the slot width of the strip slot 23 increases gradually.

Based on the above embodiments, the present disclosure also provides an MEMS sensor, which includes the afore-mentioned MEMS diaphragm. The MEMS diaphragm is provided with an additional material layer 20 on the main diaphragm 10, the additional material layer 20 mechanically reinforces the diaphragm region experiencing high stress during a pressure pulse, and the intrinsic tensile stress of the additional material layer 20 is greater than the intrinsic tensile stress of the main body sensing portion 11, so that the compliance of the main diaphragm 10 can be guaranteed, the mechanical sensitivity of the MEMS diaphragm is improved, and the reliability of the MEMS sensor is increased.

The structure, features and effects of the present disclosure have been described in detail above based on the embodiments shown in the drawings. The above descriptions are only preferred embodiments of the present disclosure, but the present disclosure does not limit the scope of implementation as shown in the drawings. Changes or modifications made based on the concept of the present disclosure are still within the protection scope of the present disclosure.

What is claimed is:

1. A micro-electromechanical system (MEMS) diaphragm, comprising:
    a main diaphragm comprising a main body sensing portion and beam portions, wherein and the beam portions are connected to an outer edge of the main body sensing portion;
    an additional material layer provided on the beam portions or provided on both an edge of the main body sensing portion and on the beam portions;
    wherein an intrinsic tensile stress of the additional material layer is greater than an intrinsic tensile stress of the main body sensing portion; the additional material layer is provided with concentrically arranged annular slots, and the annular slots are sequentially arranged at intervals along a radial direction of the main body sensing portion.

2. The MEMS diaphragm according to claim 1, wherein the additional material layer is embedded in plane in the main body sensing portion.

3. The MEMS diaphragm according to claim 1, wherein the additional material layer is stacked on top or bottom of the main body sensing portion.

4. The MEMS diaphragm according to claim 1, wherein the additional material layer is provided with through holes.

5. The MEMS diaphragm according to claim 1, wherein the additional material layer is provided with strip-shaped slots, and the strip-shaped slots are arranged at annular intervals with an axis of the main body sensing portion as a center line.

6. The MEMS diaphragm according to claim 1, wherein the beam portion comprises a fixing beam and a connecting beam, and one end of the connecting beam is connected to a middle portion of the fixing beam, and the other end of the connecting beam is connected with the main body sensing portion.

7. The MEMS diaphragm according to claim 6, wherein arc notches are formed on opposite sides of the connecting beam.

8. The MEMS diaphragm according to claim 6, wherein anchor portions are provided at both ends of the fixing beam.

9. The MEMS diaphragm according to claim 1, wherein the additional layer is made of silicon nitride, and the main layer is made of poly silicon.

10. The MEMS diaphragm according to claim 9, wherein the additional layer has a stress higher than 100 MPa without a stress gradient.

11. A micro-electromechanical system (MEMS) sensor, comprising a MEMS diaphragm, wherein the MEMS diaphragm comprises:
    a main diaphragm comprising a main body sensing portion and beam portions, wherein and the beam portions are connected to an outer edge of the main body sensing portion;
    an additional material layer provided on the beam portions or provided on both an edge of the main body sensing portion and on the beam portions;
    wherein an intrinsic tensile stress of the additional material layer is greater than an intrinsic tensile stress of the main body sensing portion; the additional material layer is provided with concentrically arranged annular slots, and the annular slots are sequentially arranged at intervals along a radial direction of the main body sensing portion.

\* \* \* \* \*